(12) United States Patent
Jahnke et al.

(10) Patent No.: US 7,518,941 B2
(45) Date of Patent: Apr. 14, 2009

(54) METHODS AND APPARATUS TO PROVIDE REFRESH FOR LOCAL OUT OF RANGE READ REQUESTS TO A MEMORY DEVICE

(75) Inventors: Steven Richard Jahnke, Tokyo (JP); Hiromichi Hamakawa, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 286 days.

(21) Appl. No.: 11/512,676

(22) Filed: Aug. 30, 2006

(65) Prior Publication Data

US 2008/0056054 A1    Mar. 6, 2008

(51) Int. Cl.
*G11C 8/00*     (2006.01)

(52) U.S. Cl. .............................. 365/230.06; 365/189.09

(58) Field of Classification Search ............. 365/230.06
See application file for complete search history.

(56) References Cited

U.S. PATENT DOCUMENTS 6,414,900 B1 *   7/2002   Spriggs et al. ......... 365/230.06

* cited by examiner

*Primary Examiner*—Huan Hoang
*Assistant Examiner*—Jason Lappas
(74) *Attorney, Agent, or Firm*—Dawn V. Stephens; Wade James Brady, III; Frederick J. Telecky, Jr.

(57) ABSTRACT

Methods and apparatus to provide refresh for local out of range read requests for a memory device are disclosed. An example method disclosed herein provides a read signal to a memory cell. An address is received on row address lines ranging from a most significant bit row address line to a least significant bit row address line. A fixed high logic input is coupled to a first input of a row driver logic device associated with a local out of range address. Logic is provided to send a read enable signal on a bit line coupled to an output of the row driver logic device coupled to the memory cell if the address is the local out of range address.

15 Claims, 5 Drawing Sheets

METHODS AND APPARATUS TO PROVIDE REFRESH FOR LOCAL OUT OF RANGE READ REQUESTS TO A MEMORY DEVICE

FIELD OF THE DISCLOSURE

This disclosure relates generally to memory devices and, more particularly, to methods and apparatus to provide refresh for local out of range read requests to a memory device.

BACKGROUND

Asynchronous embedded static random access memory (SRAM) is a common memory device that requires refreshing of its memory cells to retain stored data. Embedded SRAM memory cells are typically composed of devices that hold data without having to refresh individual cells. However, the cells must have a complete electrical path in order to avoid a float state that may cause data integrity loss. Rather than refreshing on a periodic basis, which decreases the time during which a memory may be accessed, refreshes of the memory cells are typically performed only during a read operation, during which the memory cells are read and a complete electrical path is maintained to enable the memory to retain the data.

A typical memory array includes eight word rows and multiple base two columns. The row is first selected and then the column is selected to cause the data from a particular memory cell to be addressed and refreshed by maintaining a completed electrical path. However, a circuit design using memory may not require an entire full base two range of columns or blocks or all the possible memory addresses in a row. Power conservation and gate efficiency is an important factor in circuit design and, thus, it is desirable to eliminate unnecessary memory capacity. For example, in the case of application specific integrated circuit (ASIC) standard 2 port memory, users may configure the word length, bit length and x-y ratio by entering a desired memory length resulting in odd numbers of word lengths. When the addresses of words are not used, they are referenced as a global out of range in the case of an unused column address or a local out of range in the case of unused row addresses. For example, if a memory only requires 59 words, there would be 7 full columns, but the last column would use only rows 0-2 and, thus, rows 3-7 are out of range local addresses.

To read data from each cell, an address is sent to various row bit lines and column select lines that allow a particular word to be read. However, the cells must be refreshed during any read request because there is no scheduled refresh of the memory cells. In the case of a read request directed to either a local or global out of bounds address (e.g., an attempt to access the words rows 3-7 in the last column in the above example), the read request results in not refreshing the accessed memory because the appropriate row and column does not exist, thereby breaking the complete electrical path and resulting in the row bit line floating in a tristate condition and destroying stored data. Thus, to insure that the memory array is refreshed whenever an out of range address is received, the words in an existing row or column must be addressed to refresh the memory. The logic to determine the out of range address and refresh the appropriate existing memory blocks requires additional gates (e.g., out of range detection logic) and increases power consumption. In certain cases, access time to the memory is also increased because of the complexity of the out of range detection logic. Further, drive conflicts may occur because of propagation delay causing interference with subsequent read requests.

DETAILED DESCRIPTION

Figure 1:
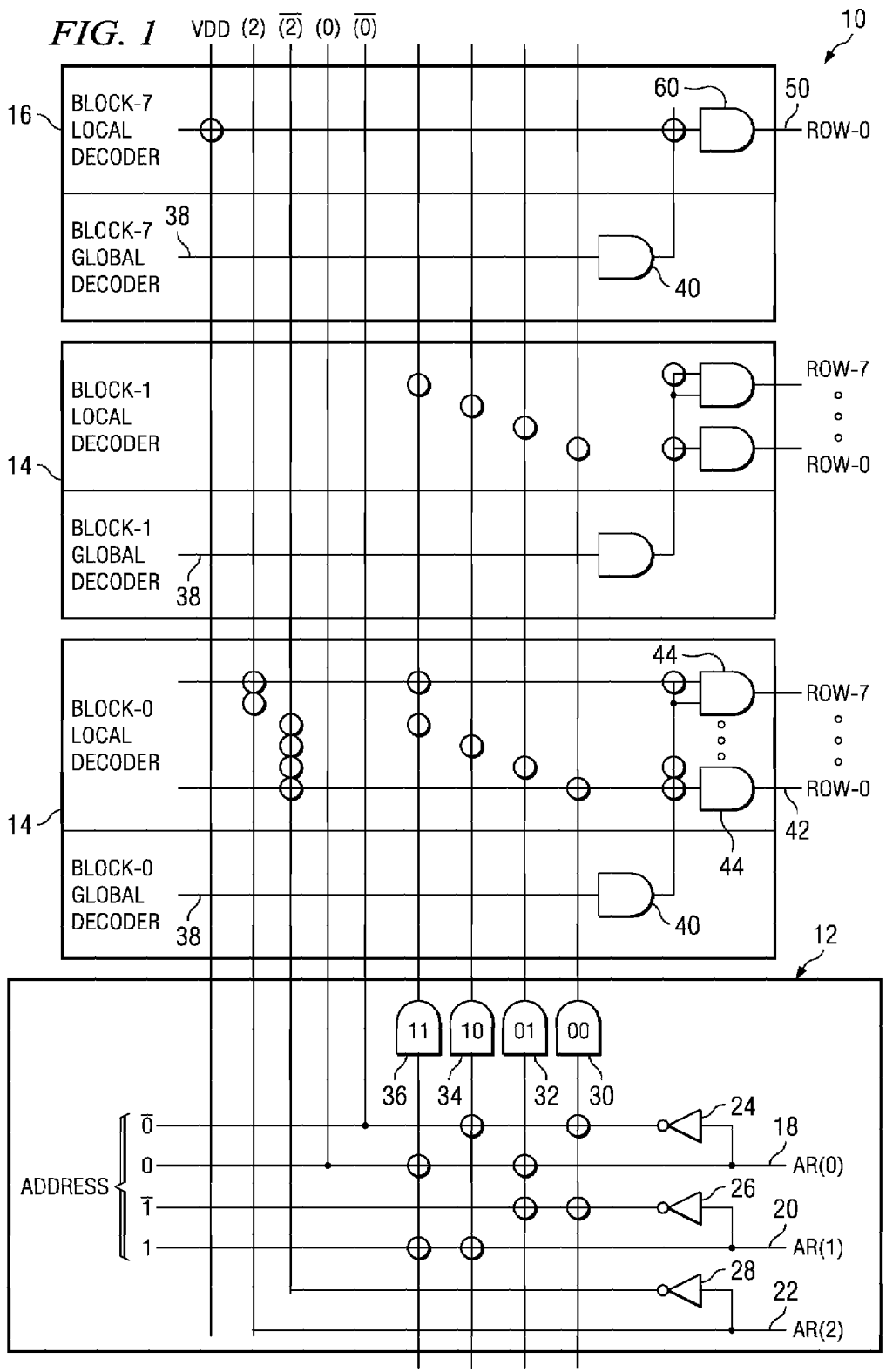
FIG. 1 is a circuit diagram of a portion of an example memory array including an example local out of range circuit.

FIG. 1 is a circuit diagram of an example embedded SRAM memory array 10 having a local out of range circuit 12, which relays row address requests to memory blocks in the memory array 10. The memory array 10 has a series of memory blocks 14 (blocks 0-6) and a last memory block 16 (block 7). Each of the blocks 14 holds eight words in rows 0-7. Thus, the memory array 10 has a maximum of 64 word addresses. In this example, the memory array 10 has 57 addressable words and, thus, requests made for part of the last memory block 16 include local out of range row addresses.

The memory blocks 14 each include eight words (0-7), which are addressed using row address inputs 18, 20 and 22 and which represent a 3 bit row address having bits ranging from a most significant bit to a least significant bit. Each of the row address inputs 18, 20 and 22 are coupled to a corresponding inverter 24, 26 and 28 to provide an inverted row address signal. The two least significant bit row address inputs 18 and 20, in conjunction with the inverters 24 and 26, drive a series of two input AND gates 30, 32, 34 and 36, each of which outputs a high value when a particular row address is input to serve as the read control for activating the corresponding rows in the memory blocks 14. For example, when the row having the least significant bits 00 is selected, the AND gate 30 outputs a high voltage read control signal to row 0 and row 4 of the memory blocks 14. Those of ordinary skill in the art will understand that other logical devices such as NAND gates or combinations of logic devices with different inputs and outputs may be used instead of or in addition to the AND gates 30, 32, 34 and 36.

Each of the memory blocks 14 and 16 is addressed by a global decoder line 38, which is selected by additional column address inputs that may range from AC(0) to AC(3) (not shown) for selecting a specific memory block from the memory blocks 14 and 16. The global decoder line 38 is coupled to both inputs of a two input AND gate 40. Each of the rows 0-7 in the memory blocks 14 have a bit line 42 that is output from a three input row driver AND gate 44. The bit line 42 normally has a high value to hold the data in the particular word or memory cell. The bit line 42 is set to high to read and refresh the data in the particular word or memory cell.

One input of each of the three input row driver AND gates 44 is connected or coupled to the global decoder lines 38 through the AND gates 40. The second input of each of the three input row driver AND gates 44 is coupled to the output of one of the two input AND gates 30, 32, 34 and 36. The third input of each of the three input row driver AND gates 44 is coupled to either the row address input 22 or the output of the inverter 28 representing the inverted most significant row address bit. In such a manner, a specific word from the memory blocks 14 may be read via the bit line 42. For example, a read command for reading the word at address 29 is processed by inputting a row address of 101 to the row address inputs 18, 20 and 22. An input of 01 to the row address inputs 18 and 20 causes the AND gate 32 to output a high signal to the second input of the row driver AND gates 44 for rows 1 and 5. The input of 1 on the row address input 22, the most significant row address bit, results in a high input to the row driver AND gates 44 connected to rows 4-7. Those of ordinary skill in the art will understand that other logical devices such as NAND gates or combinations of logic devices with different inputs and outputs may be used for the row driver AND gates 44.

A column address of 011 input to the column address inputs selects block 2 and sends a high signal on the global address line 38 for the memory block 14 for block 2. The high signal is amplified by the AND gate 40 and input to the row driver AND gates 44 for all the rows (0-7) in block 2. In this manner, the output of the row driver AND gate 44 relating to row 5, block 2 outputs a high signal on the bit line 42 for row 5 causing a read and refresh to occur for the word for address 5.

Because the memory array 10 has 57 words, the only word that is addressable in the memory block 16 (block 7) is row 0. A single bit line 50 drives the read operation of the word 0. The bit line 50 is output from a three input row driver AND gate 60. The global bit line 38 is coupled to one input of the row driver AND gate 60. The other two inputs of the row driver AND gate 60 are coupled to a fixed high logic input 80, which may be a voltage source (e.g., at a logical high potential). If an out of range address (i.e., rows 1-7) of block 7 is requested, the bit line 50 changes to a high signal from the high logic input 80 and the global bit line 38 sends high signals to the inputs of the row driver AND gate 60 to prevent a tristate condition in the word 0.

Figure 2:
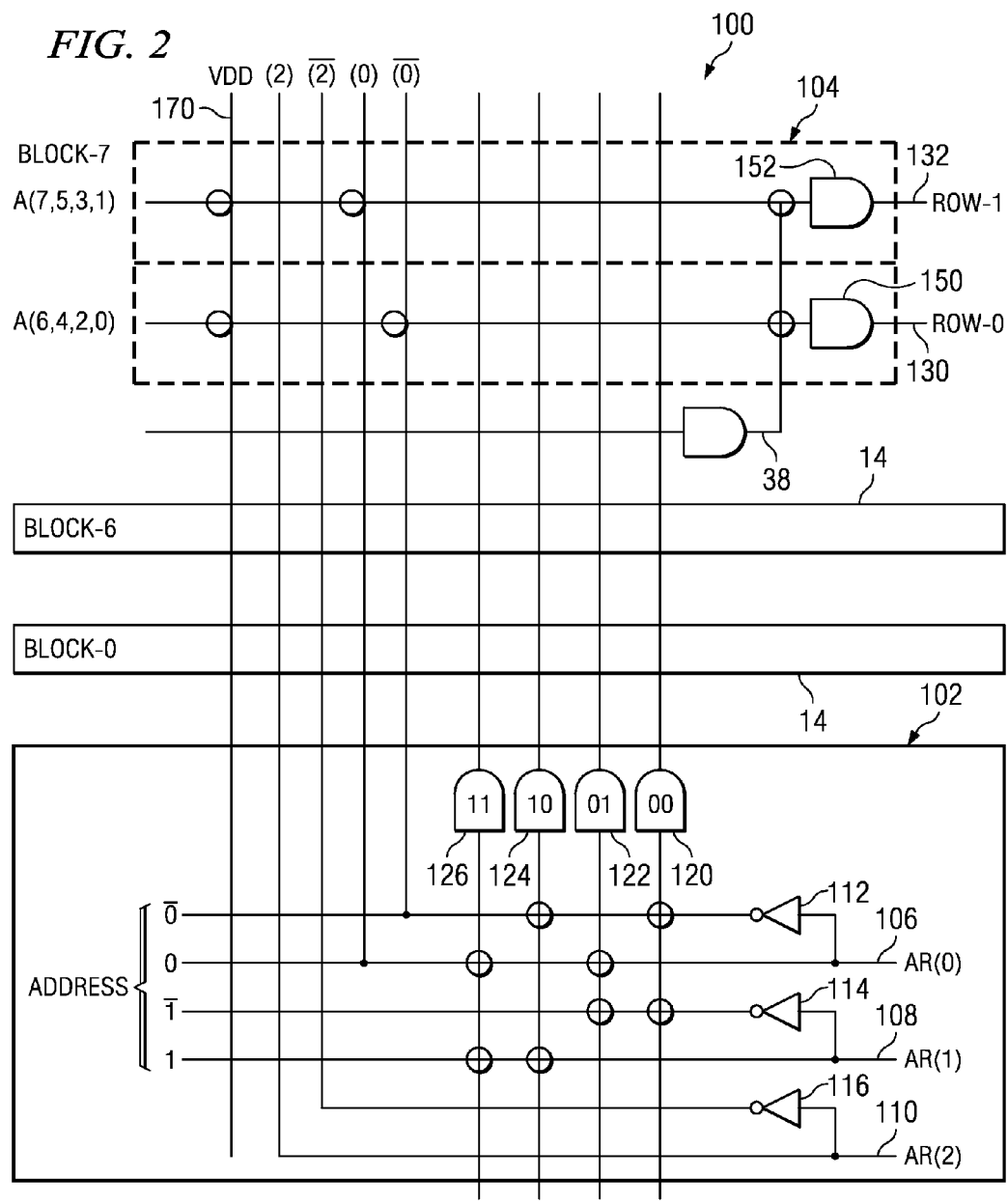
FIG. 2 is a circuit diagram of a portion of an example memory array including another example local out of range circuit.

FIG. 2 is a circuit diagram of an example memory array 100 with another local out of range circuit 102. The memory array 100 includes a last memory block 104, which has local out of range word addresses. The local out of range circuit 102 is used to select row addresses of the memory blocks 14, which are identical to the memory blocks 14 in FIG. 1 and, thus, identical elements have identical reference numbers. The memory array 100 has 58 words and, thus, rows 2-7 of the memory block 104 (block 7) are out of range.

The memory block 104 includes two words (rows 0-1) that are addressed using row address inputs 106, 108 and 110, which are a 3-bit row address having a most significant bit to a least significant bit. Each of the row address inputs 106, 108 and 110 is coupled to a corresponding inverter 112, 114 and 116 to provide an inverted row address signal of the corresponding bit of the row address. The two least significant bit row address inputs 106 and 108 in conjunction with the inverters 112 and 114 drive a series of two input AND gates 120, 122, 124 and 126, each of which outputs a high value when a particular row address is input and, thus, serve as the read control. For example, when the 01 row is selected, the AND gate 122 outputs a high read control signal.

The example memory array 100 in FIG. 2 allows memory access to words in rows 0-7 in the memory blocks 14. However, the only words addressable in the memory block 104 are words 0 and 1, which have corresponding bit lines 130 and 132 that are driven by row driver AND gates 150 and 152, respectively. One of the inputs of the row driver AND gates 150 and 152 is coupled to the global decoder line 38. The second input of the row driver AND gates 150 and 152 is coupled to a fixed high logic input 170. Thus, when the memory block 104 (block 7) is selected by a column address, the first and second inputs of the row driver AND gates 150 and 152 are driven high by the global decoder line 38 and the high logic input 170. The third input of the row driver AND gate 150 is coupled to the row address input 106 representing the least significant address bit while the third input of the row driver AND gate 152 is coupled to the inverter 112, which outputs the inverted least significant address bit input value. A local out of range address request (e.g., any request that includes rows 3-7 in block 7) provides a high signal to the third input of either the row driver AND gates 150 and 152 via the row address input 106, thereby causing a high signal on either of the bit lines 130 and 132. For example, if rows 3, 5 or 7 are requested, which are all out of range address requests, the address line 106 will output a low signal that is output high by the inverter 112. This causes a high signal to be input to the row driver AND gate 152 which, in turn, causes the row 1 to be refreshed via a memory read high signal on the bit line 132.

Figure 3:
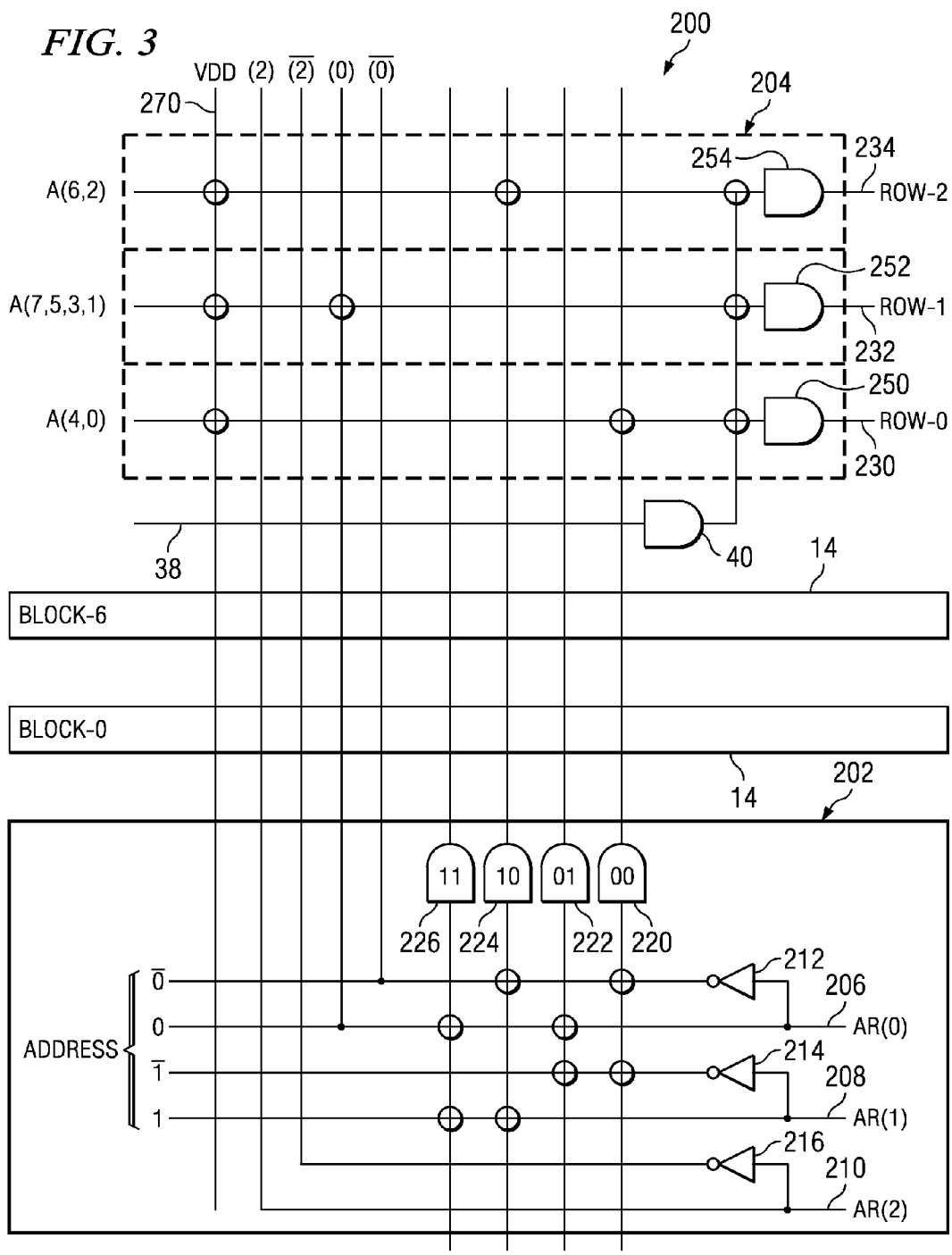
FIG. 3 is a circuit diagram of a portion of an example memory array including yet another example local out of range circuit.

FIG. 3 is a circuit diagram of an example memory array 200 with yet another local out of range circuit 202. The memory array 200 includes a memory block 204, which has local out of range word addresses. The local out of range circuit 202 is used to select row addresses of other memory blocks 14, which are identical to the memory blocks 14 in FIG. 1 and, thus, identical elements have identical reference numbers. The memory circuit 200 has 59 words and, thus, rows 3-7 of the memory block 204 (block 7) are out of range.

The memory block 204 includes three words (0-2), which are addressed using row address inputs 206, 208 and 210. Each of the row address inputs 206, 208 and 210 is coupled to a corresponding inverter 212, 214 and 216 to provide an inverted address signal. The two least significant bit row address inputs 206 and 208 in conjunction with the inverters 212 and 214 drive a series of two input AND gates 220, 222, 224 and 226, each of which output a high value when a particular row address is input and, thus, serve as the read control. For example, when a row address with 11 as the two least significant bits is selected, the AND gate 226 outputs a high read control signal.

The memory array 200 in FIG. 3 allows memory access to words in rows 0-2 in the memory block 204. The words in rows 0-2 have corresponding bit lines 230, 232 and 234, which are driven by three input row driver AND gates 250, 252 and 254, respectively. The first input of the three input row driver AND gates 250, 252 and 254 is coupled to the output of the global decoder line 38 and the AND gate 40. The second input of the row driver AND gates 250, 252 and 254 is coupled to a fixed high logic input 270. The third input of the row driver AND gate 250 is coupled to the output of the AND gate 220. The third input of the row driver AND gate 252 is coupled to the row address line 206. The third input of the row driver AND gate 254 is coupled to the output of the AND gate 224. An out of range address request that includes rows 3, 5 or 7 will thus provide a high signal to the third input of the row driver AND gate 252 via the row address input 206 thus causing a high signal to activate the read refresh on the bit line 232. If an out of range address request for row 4 is requested, the address lines 206 and 208 in conjunction with inverters 112 and 114 will cause a high signal to be output from the AND gate 220. This causes a high signal to be input to the third input of the row driver AND gate 250 driving the bit line 230 high to refresh row 0. Similarly, if the out of range address is row 6, the address lines 206 and 208 in conjunction with the inverter 112 cause a high signal to be output from the AND gate 224, which causes a high signal to be sent to the third input of the AND gate 254 and the bit line 234 to be driven high to refresh row 2. In the case where rows 4-7 are out of range, the local out of range circuit 202 may be modified to have the corresponding row driver AND gates coupled to the bit lines for enabling the rows 0-3 coupled to the AND gates 220, 222, 224 and 226.

Figure 4:
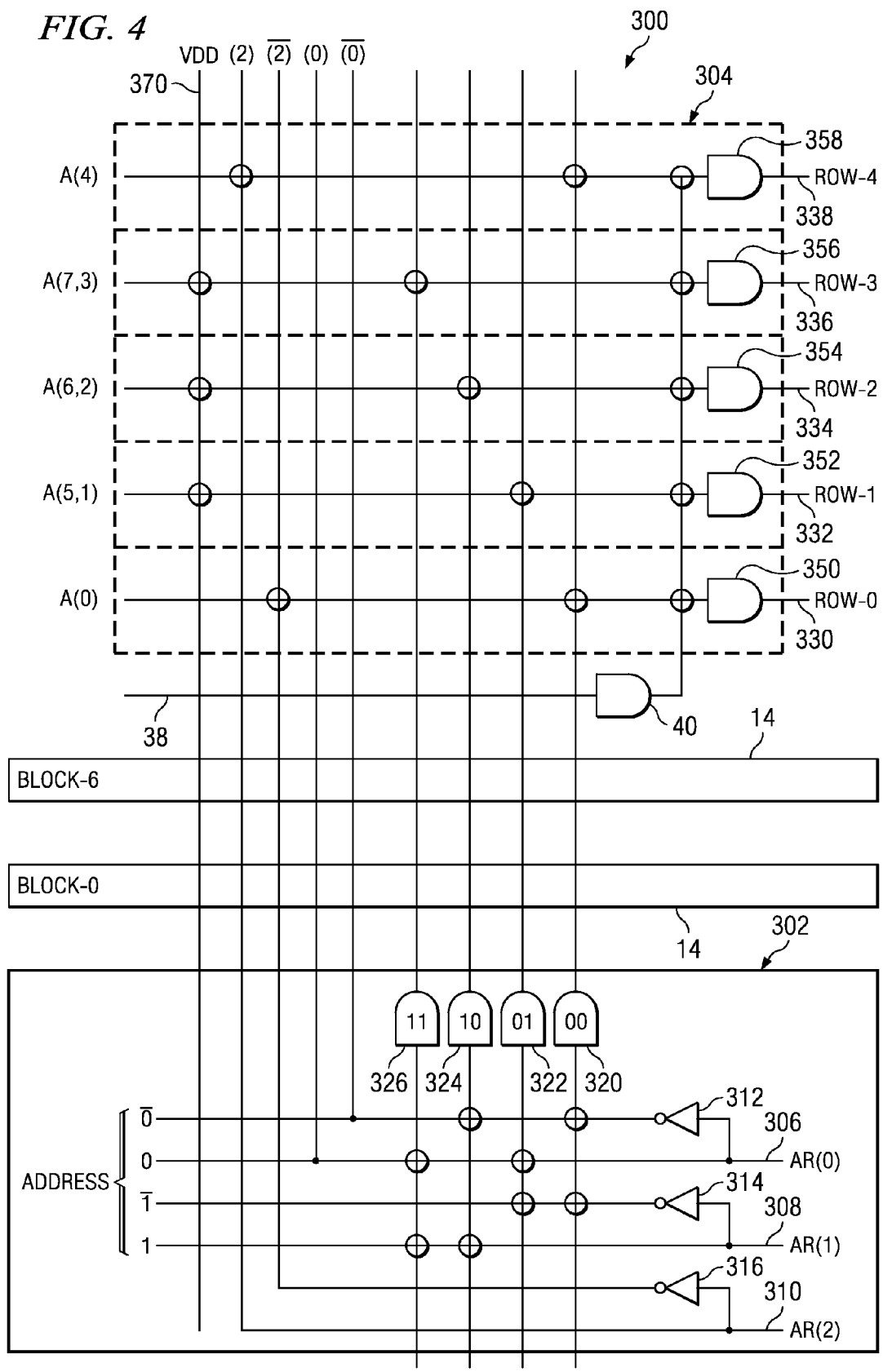
FIG. 4 is a circuit diagram of a portion of an example memory array including still another example local out of range circuit.

FIG. 4 is a circuit diagram of an example memory array 300 with still another local out of range circuit 302. The memory array 300 includes a memory block 304 that has local out of range word addresses. The local out of range circuit 302 is used to select row addresses of other memory blocks 14, which are identical to the memory blocks 14 in FIG. 1 and, thus, identical elements have identical reference numbers. The memory array 300 has 61 words and, thus, rows 5-7 of the memory block 304 (block 7) are out of range.

The memory block 304 includes five words (0-5) that are addressed using row address inputs 306, 308 and 310. Each of the row address inputs 306, 308 and 310 is coupled to a corresponding inverter 312, 314 and 316 to provide an inverted address signal. The two least significant bit row address inputs 306 and 308 in conjunction with the inverters 312 and 314 drive a series of two input AND gates 320, 322, 324 and 326, each of which outputs a high value when one of the four values of the two least significant bits of a particular row address is input and, thus, serve as the read control. For example, when the 11 row is selected, the AND gate 326 outputs a high read control signal.

The circuit 300 in FIG. 4 allows memory access to words in rows 0-4 in the memory block 304. The words in rows 0-4 have corresponding bit lines 330, 332, 334, 336 and 338, which are driven by three input row driver AND gates 350, 352, 354, 356 and 358, respectively. The first inputs of the row driver AND gates 350, 352, 354, 356 and 358 are coupled to the output of the AND gate 40, which is driven by the global decoder line 38. The second inputs of the row driver AND gates 350 and 358 are driven by the output of the AND gate 320. The second inputs of the row driver AND gates 352, 354 and 356 are coupled to the outputs of the row driver AND gates 322, 324 and 326, respectively.

The row address input 310 representing the most significant address bit is coupled via the inverter 316 to the third input of the row driver AND gate 350. The row address input 310 is coupled to the third input of the row driver AND gate 358. The row driver AND gates 350 and 358 provide read outputs because row 0 and row 4 are both in range. The third inputs of each of the row driver AND gates 352, 354 and 356 are coupled to a high logic input 370. An out of range address request that includes row 5, 6 or 7 (101, 110 or 111 input to row address inputs 306, 308 and 310) provides a high signal to the third input of the row driver AND gates 352, 354 or 356 via the AND gates 322, 324 and 326. This causes a high signal triggering a read refresh on the respective bit lines 332, 334 or 336 refreshing one of the rows 5, 6 or 7 from an out of range request.

In a similar manner, a local out of range circuit may be implemented for out of range addresses for row 6 and row 7 by modifying the local out of range circuit 302 in FIG. 4. The local out of range circuit 302 may be modified by coupling the most significant bit row address line such as the row address line 310 and corresponding inverter 316 to the AND gates driving the different rows, which are addressable. The third input of the AND gates associated with common least significant bits of the potential out of range row addresses (i.e., row driver gates 354 and 356) may be coupled to the high logic input 370.

Figure 5:
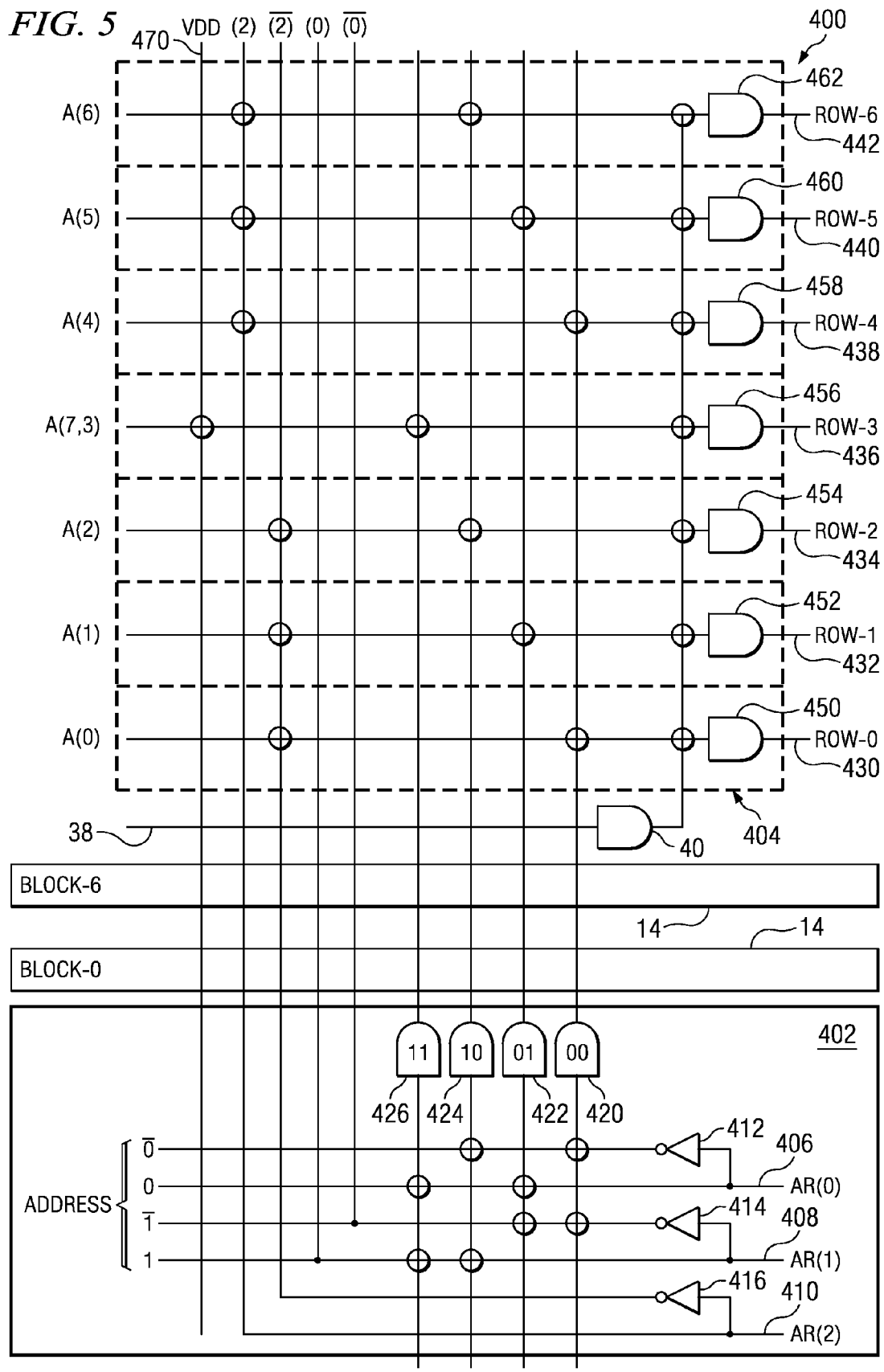
FIG. 5 is a circuit diagram of a portion of an example memory array including yet another example local out of range circuit.

FIG. 5 is a circuit diagram of an example memory array 400 with still another local out of range circuit 402. The memory array 400 includes a memory block 404, which has local out of range word addresses. The local out of range circuit 402 is used to select row addresses of other memory blocks 14, which are identical to the memory blocks 14 in FIG. 1 and, thus, identical elements have identical reference numbers. The memory array 400 has 63 words and, thus, row 7 of the memory block 404 (block 7) is an out of range address.

The memory block 404 includes seven words (rows 0-6), which are addressed using row address inputs 406, 408 and 410. Each of the row address inputs 406, 408 and 410 is coupled to a corresponding inverter 412, 414 and 416 to provide an inverted address signal. The two least significant bit row address inputs 406 and 408 in conjunction with the inverters 412 and 414 drive a series of two input AND gates 420, 422, 424 and 426, each of which outputs a high value when one of the four values of the two least significant bits of a particular row address are input and, thus, serve as the read control.

The example circuit 400 in FIG. 5 allows memory access to words in rows 0-6 of the memory block 404. The words in rows 0-6 have corresponding bit lines 430, 432, 434, 436, 438, 440, and 442, which are driven by three input row driver AND gates 450, 452, 454, 456, 458, 460 and 462, respectively. The first inputs of the three input row driver AND gates 450, 452, 454, 456, 458, 460 and 462 are coupled to the output of the AND gate 40, which is driven by the global decoder line 38. The second inputs of the row driver AND gates 450 and 458 are coupled to the output of the AND gate 420. The second inputs of the row driver AND gates 452 and 460 are coupled to the output of the AND gate 422. The second inputs of the row driver AND gates 454 and 462 are coupled to the output of the AND gate 424. The second input of the row driver AND gate 456 is coupled to the output of the AND gate 426.

The row address input 410 representing the most significant row address bit is coupled via the inverter 416 to the third input of the row driver AND gates 450, 452 and 454 and are used to address rows 0-2 which are valid addresses. The row address input 410 is coupled to the third input of the row driver AND gates 458, 460 and 462 and is used to address rows 4-6, which are valid addresses. The third input of the row driver AND gate 456 is coupled to a high logic input 470. An out of range address request that includes row 7 provides a high signal to the third input of the row driver AND gate 356 via the AND gate 326, thereby causing a high signal to read refresh on the bit lines 336 refreshing row 3 during the out of range request.

From the foregoing, persons of ordinary skill in the art will appreciate that the above disclosed methods and apparatus may be realized within a single device or across two cooperating devices, and could be implemented by software, hardware, and/or firmware to implement the example local out of range circuits disclosed herein.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of providing a read signal to a memory cell, comprising:
   receiving an address on row address lines ranging from a most significant bit row address line to a least significant bit row address line;
   coupling a fixed high logic input to a first input of a row driver logic device associated with a local out of range address; and
   providing logic to send a read enable signal on a bit line coupled to an output of the row driver logic device coupled to the memory cell if the address is the local out of range address;
   wherein the memory cell has a three bit address and wherein the row driver logic device is associated with the local out of range address if the out of range address has the same two least significant bit values as the two least significant bits of the address of the memory cell.

2. The method of claim 1 further comprising coupling the fixed high logic input to a second input of the row driver logic device, and wherein the local out of range address is one of seven local out of range three bit addresses.

3. The method of claim 1 further comprising:
coupling a series of four decoder logic devices to the two least significant bit row address lines, each decoder logic device outputting a signal for one of the four values of the two least significant row address lines;
coupling the output of one of the four decoder logic devices to a second input of the row driver logic device if less than four possible local out of range three bit addresses exist; and
coupling the inverted most significant bit row address line to the first input of the row driver logic device.

4. The method of claim 1 further comprising coupling the least significant bit row address line to a second input of the row driver logic device if four possible local out of range three bit addresses exist.

5. The method of claim 1 wherein providing the logic further includes:
coupling an output of a second row driver logic device to a second bit line to enable a read signal to a second memory cell having a second three bit address; and
coupling the fixed high logic output to a first input of the second row driver logic device if the possible local out of range three bit addresses include the same two least significant values as the two least significant bits of the address of the second memory cell.

6. The method of claim 1, wherein the memory cell is part of a first memory block in a memory block including at least a second block of memory cells.

7. The method of claim 6, wherein the row driver logic device is an AND gate having a third input coupled to a column enable input.

8. A row address decoder comprising:
a row address input having row address lines ranging from a most significant bit row address line to a least significant bit row address line;
a fixed high logic input;
a row driver logic device associated with a local out of range address, the row driver logic device having an input coupled to the fixed high logic input and an output coupled to a bit line coupled to a memory cell; and
decoding logic to activate the row driver logic device to send a read enable signal on the bit line if a row address received on the row address input is the local out of range address;
wherein the memory cell has a three bit address and wherein the row driver logic device is associated with the local out of range address if the out of range address has the same two least significant bit values as the two least significant bits of the address of the memory cell.

9. The row address decoder of claim 8, wherein the row driver logic device is an AND gate.

10. The row address decoder of claim 9, wherein the AND gate includes an input coupled to a column enable line.

11. The row address decoder of claim 8, wherein the local out of range address is one of at least seven local out of range three bit addresses.

12. The row address decoder of claim 8, wherein the local out of range address is one of four local out of range three bit addresses.

13. A row address decoder comprising:
a row address input having row address lines ranging from a most significant bit row address line to a least significant bit row address line;
a fixed high logic input;
a row driver logic device associated with a local out of range address, the row driver logic device having an input coupled to the fixed high logic input and an output coupled to a bit line coupled to a memory cell; and
decoding logic to activate the row driver logic device to send a read enable signal on the bit line if a row address received on the row address input is the local out of range address;
wherein the memory cell has a three bit address and wherein the local out of range address is one of up to three local out of range three bit addresses, the row address decoder further comprising:
second through fifth bit lines coupled to respective second through fifth memory cells;
second through fifth row driver logic devices, each having an output coupled to one of the second through fifth bit lines;
an inverted most significant bit address line;
wherein the second row driver logic device has a first input coupled to the inverted most significant bit address line and the fifth row driver logic device has a first input coupled to the most significant bit address line, and at least one of the first inputs of the third and fourth row driver logic devices is coupled to the fixed high logic input;
wherein the decoding logic includes a logic decoder having inputs coupled to the two least significant bit address lines to output a high logic signal in response to one of the four values of the two least significant bit address lines, and
the output of the row logic decoder is coupled to the second input of one of the five row driver logic devices; and
wherein the one of the row driver logic devices outputs a read enable signal on the respective bit line when the received row address is one of the three local out of range three bit addresses.

14. The row address decoder of claim 13 further comprising:
a sixth row driver logic device having an output coupled to a sixth bit line, the sixth row driver logic device having a first input coupled to the most significant bit address line, and a second input coupled to an output of the logic decoder;
wherein the second input of the third row driver logic device is coupled to the inverted most significant bit address line; and
wherein the row driver logic device or the fourth row driver logic device outputs a read enable signal on the respective bit line when the received row address is one of two local out of range three bit addresses.

15. The row address decoder of claim 13 further comprising:
a sixth and a seventh row driver logic device, each having an output coupled to a sixth and seventh bit line respectively, a first input coupled to the most significant bit address line and a second output coupled to the output of the row logic decoder;
wherein the second input of each of the second, third and fourth row driver logic devices is coupled to the inverted most significant bit address line; and
wherein the row driver logic device outputs a read signal on the bit line when the received row address is the greatest local out of range three bit address.

* * * * *